United States Patent [19]
Chih

[11] Patent Number: 6,014,331
[45] Date of Patent: Jan. 11, 2000

[54] CIRCUIT FOR PROGRAMMING A PROGRAMMABLE MEMORY CELL

[75] Inventor: Yue-Der Chih, Hsinchu, Taiwan

[73] Assignee: Taiwan Semiconductor Manufacturing Co., Ltd., Hsinchu, Taiwan

[21] Appl. No.: 09/141,367

[22] Filed: Aug. 27, 1998

[51] Int. Cl.$^7$ ................................................. G11C 16/06
[52] U.S. Cl. ................................ 365/185.25; 365/185.23
[58] Field of Search ........................... 365/185.25, 185.23

[56] References Cited

U.S. PATENT DOCUMENTS

| | | | |
|---|---|---|---|
| 5,008,856 | 4/1991 | Iwahashi | 365/185.17 |
| 5,268,886 | 12/1993 | Momodomi et al. | 365/203 |
| 5,532,964 | 7/1996 | Cernea et al. | 365/189.09 |
| 5,777,945 | 7/1998 | Sim et al. | 365/230.06 |

*Primary Examiner*—David Nelms
*Assistant Examiner*—Hoai V. Ho
*Attorney, Agent, or Firm*—Harold L. Novick; Nath & Associates

[57] ABSTRACT

The circuitry for programming a flash EEPROM memory cell has a data import circuit for receiving a data signal and a programming signal. Switching circuit is coupled with the data input circuit and responsive to the programming signal for transmitting the data signal to achieve the memory cell from the output of the data input circuit. Discharge control circuit, is coupled with the switch circuit for discharging the bit line voltage of the memory cell. The discharge control circuit comprises two NMOS transistor and a PMOS transistor. First one of the NMOS is coupled with a PMOS in a series so as to construct a shunt circuit for discharging the bit line voltage and the PMOS is then coupled with the second NMOS in a parallel way. The gate terminal of PMOS is then responsive to ground voltage, the gate terminals of two NMOS are then responsive to a voltage $V_{PBIAS}$. Decoder circuit is coupled with the switch circuit, for addressing the memory cell, wherein the decoder is under controlled by at least one transistor.

17 Claims, 7 Drawing Sheets

CIRCUIT FOR PROGRAMMING A PROGRAMMABLE MEMORY CELL

BACKGROUND OF THE INVENTION

1. Field of the Invention

The present invention pertains to the novel-volatile memory, more particularly to a programming circuitry for electrical erasable flash memories.

2. Description of the Prior Art

In recently years, the development of the portable telecommunications and laptop computers has become a major driving force in semiconductor IC's design and technology. This growing market requires low power, high-density and electrically re-writable nonvolatile memories. Electrically erasable programmable read only memories (EEPROM) which are electrically erased on a byte-by-byte basis is one choice; however, its cell size is too large for application, and thus flash memory is another choice because of its small size and highly reliability. A typical prior art circuitry for programming an electrical erasable flash memory is best illustrated by reference to the drawings.

Figure 1:
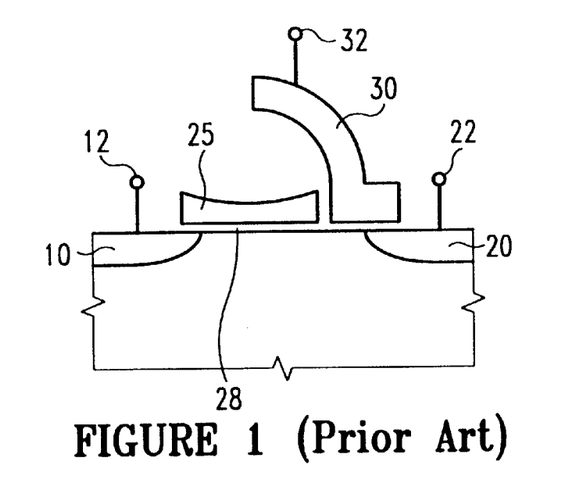
FIG. 1 is a cross-sectional view of a split gate flash memory, in accordance with the prior art.

FIG. 1 shows a simplified split gate flash memory cell, which is programming by a source-side channel hot electron injection mode (CHEI). A n+ region, which functions as the source 10 and another n+ region, functions as the drain 20 are formed in the silicon substrate. The control gate 30 via a word line connect to the periphery circuit, at the same time, a bit line 22 connects to the drain 20 and the periphery circuit. In order to program the cell, i.e. electrons via CHEI effects from the drain 20 into the floating gate 25, a high voltage $V_{SL}+11V$ is connected to the source 10. A threshold voltage $V_T$, for example, +2V is applied to a control gate 30, at the same time; the voltage of the bit line 22 is demanded to drop to about $V_{SS}$. The electron current will begin flow from source 10 toward drain 20 through the weakly inverted channel. When the electron flow see the steep rise voltage potential on the floating gate 25. The electrons be accelerated and become heated. Some of them will be injected through coupling oxide 28 and into the floating gate 25 until the potential drop on the floating gate 25 unable to sustain an induce surface channel right beneath the floating gate 25. If the floating gate 25 store with negative charges, as will be understood by those skilled in the art, the accumulation of a large quantity of trapped charge on the floating gate 25 will cause the effective threshold voltage of the transistor to increase. If this increase is sufficiently large, the transistor will remain in a conductive "off" state. When a predetermined read voltage is applied to the control gate 30 during a read operation (i.e. $V_T$>Vread), and thus it is said that the cell is in the programmed state of "0". On the contrary, if the bit line 22 voltage is maintained to about Vcc, the charge current into floating gate is weakly occurred, and thus it is in the programming state of "1".

Figure 2A:
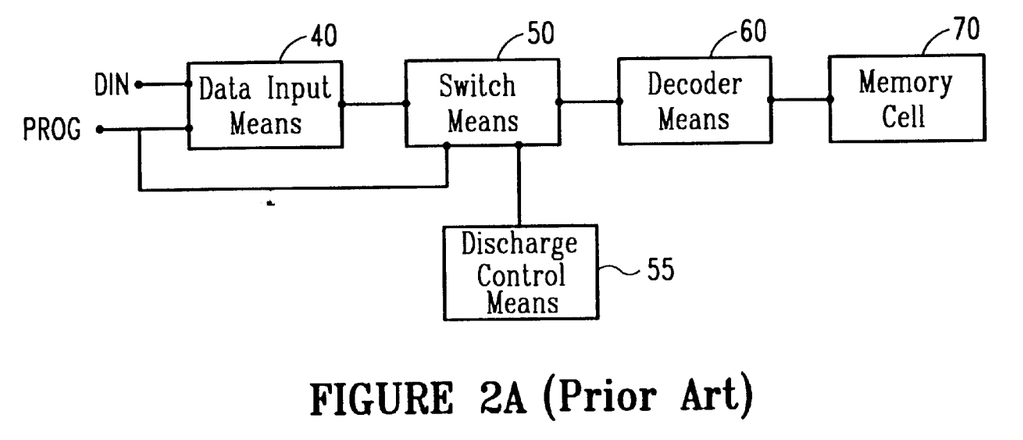
FIG. 2a shows functional blocks for programming of flash memories in accordance with the prior art.
Figure 2B:
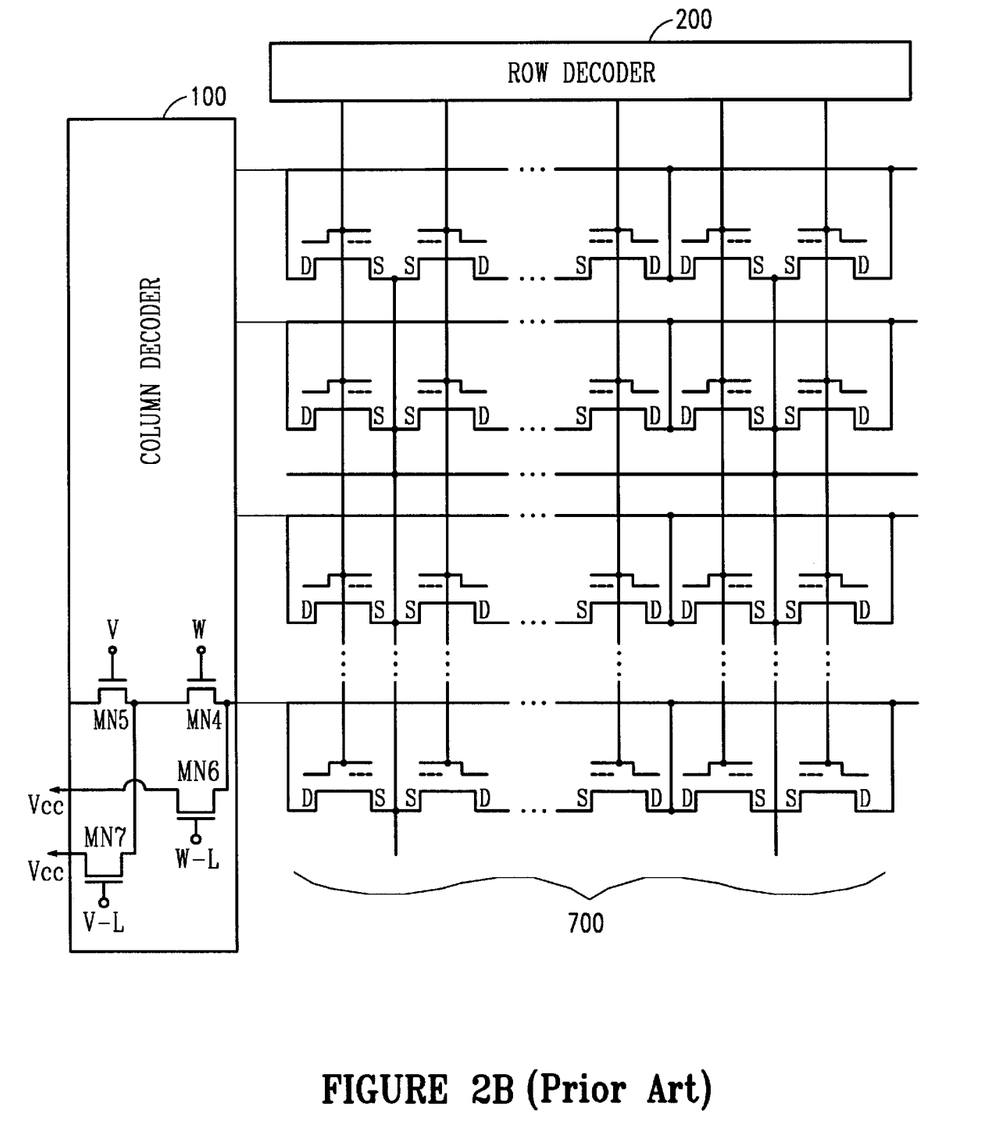
FIG. 2b is a memory array being addressed by an X decoder and an Y decoder, in accordance with the prior art.
Figure 2C:
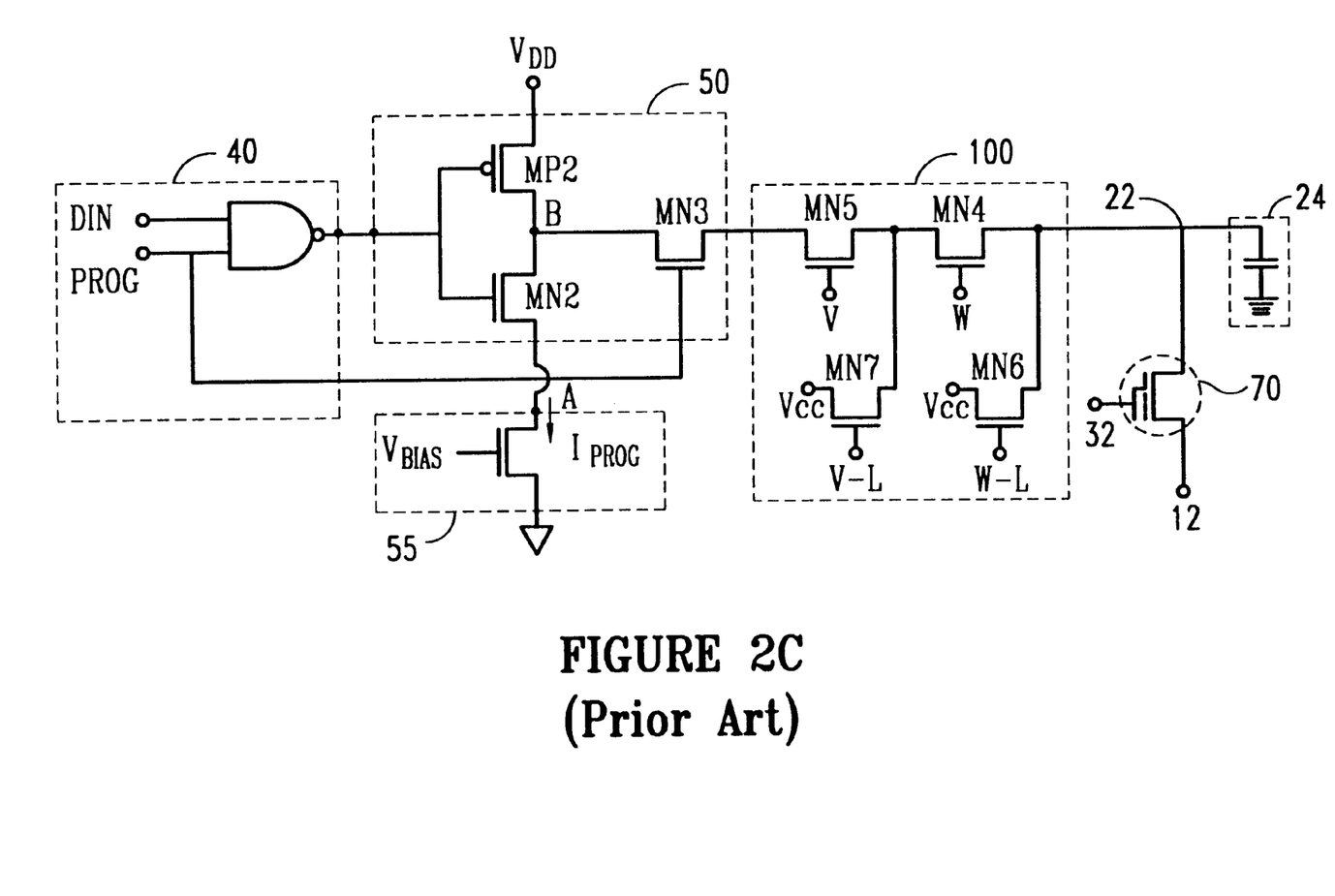
FIG. 2c is a circuitry of the programming of a flash memory cell in accordance with the prior art.

FIG. 2a shows functional blocks of a circuitry for programming a forgoing flash memory cell in accordance with the prior art. A data input means 40 having a data signal input terminal DIN to receive data signal and a programming signal input terminal PROG to receive a programming signal, and an output terminal of data input means 40 is coupled with switch means 50. Switch means 50 is then couple with a decoder 60 and a discharge control circuit 55. FIG. 2b shows an example of a memory cell 70 in memory array 700, which is arranged in a series of rows and columns. The memory cell programmed is selected by a column decoder 100 and a row decoder 200. The equivalent circuitry to functional blocks for programming a forgoing flash memory cell 70 is shown in FIG. 2c. The switch means 50 comprise a CMOS transistor being coupled with a NMOS transistor MN3. After the PROG terminal receives a programming "start" signal (i.e. at voltage high state), the switch means 50, allow the data signal received by data input circuit 40 to achieve the addressed memory cell 70(selected by decoder means 60).

Before programming, the gates voltages of transistors MN6 and MN7 are set, respectively to case 1: V(W-L)=0, V(V-L)=$V_{CC}$ or case 2:. V(W-L)=$V_{CC}$, V(V-L)=0 to pre-charge the bit line 22 of the memory cell 70 to $V_{CC}-V_T$. it is noted that the voltage of terminals W-L and V-L are set, respectively to be complementary to the terminals of W and V of transistors MN4 and MN5. In programming the "0" state, set V(W-L)=V(V-L)=0, firstly, and then the transistors MN4 and MN5 serves as a column decoder 60, which are responsive to a voltage $V_{CC}$ on input terminals V and W, respectively, to address the memory cell 70. In decoder circuit 60 that includes transistors MN4, MN5, MN6 and MN7 is a portion of column decoder 100. Please see FIG. 2a–2b. The memory celf 70 is requested at a ready state in order to program. For example, the source line 12 and the word line 32 of the memory cell 70 are applied, respectively to voltages of 11V and $V_T$. On the other hand, since before the program commence the voltage of the terminal W is $V_{CC}$, hence the bit line 22 voltage pre-charge to a level $V_{CC}-V_T$ ($V_T$ is the threshold voltage of transistor MN6). The bit line 22 voltage will be demanded to discharge by the programming current $I_{PROG}$ through the discharge control block 55, wherein the discharge control block 55 is a MOS transistor MN1 that biases by a voltage of $V_{BIAS}$ until the bit line 22 voltage decreased to about 0.6 Volt. It will take a lot of time to discharge the bit line 22. For example if the conditions are set as following: $V_{CC}$=5V, $V_T$=0.8V, the bit line loading 24 is 2 pF, and the typical programming current is $I_{PROG}$=1 µA. It will spend about 6 µs (it depends on the memory size) to discharge the bit line 22 voltage. Therefore, for programming large memories, in addition to charge the floating gate 25, it will totally require a quite obvious extra time to discharge the bit line 22.

SUMMARY OF THE INVENTION

As forging depicted, the major disadvantage of the prior art circuitry is that longer unnecessary waiting time for programming large memory cells. Therefore, the object of the present invention disclosed an improvement circuit in the discharge control block 55 for accelerating the programming speed. The circuitry comprises data input circuit, for receiving a data signal and a programming signal. Switching circuit is coupled with the data input circuit and responsive to the programming signal for transmitting the data signal to achieve the memory cell from the output of the data input circuit. Discharge control circuit, is coupled with the switch means for discharging the bit line voltage of the memory cell. The discharge control circuit comprises two NMOS transistor and a PMOS transistor. First one of the NMOS is coupled with a PMOS in a series so as to construct a shunt circuit for discharging the bit line voltage and the PMOS is then coupled with the second NMOS in a parallel way. The gate terminal of PMOS is then responsive to ground voltage, the gate terminals of two NMOS are then responsive to a voltage $V_{PBIAS}$. Decoder circuit is coupled with the switch means, for addressing the memory cell, wherein the decoder is under controlled by at least one transistor.

The additional shunt circuit (PMOS transistor in series with NMOS transistor) sinks a large discharge current when the selected bit line voltage is high. As the bit line voltage drops down to a sufficiently lower voltage this PMOS transistor will be turn off automatically.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

As is depicted in the prior art, to programming a bit (or said a byte) cell, it will take about 6 $\mu$s (the time consumption depends on the memory size) to discharge a bit line 22 before programming a flash cells commence. In addition, the memory cells in a chip are about several tens or hundreds, even thousands of kilobytes. Thus the totally of unnecessary waiting time will be significantly longer. It is, therefore, thought that there is a shunt circuit to improve discharge rate. However, it will also necessary that the shunt circuit be open while the bit line 22 discharge to about 0.6 V, and begin programming (charge the floating gate with negative charges).

Figure 3:
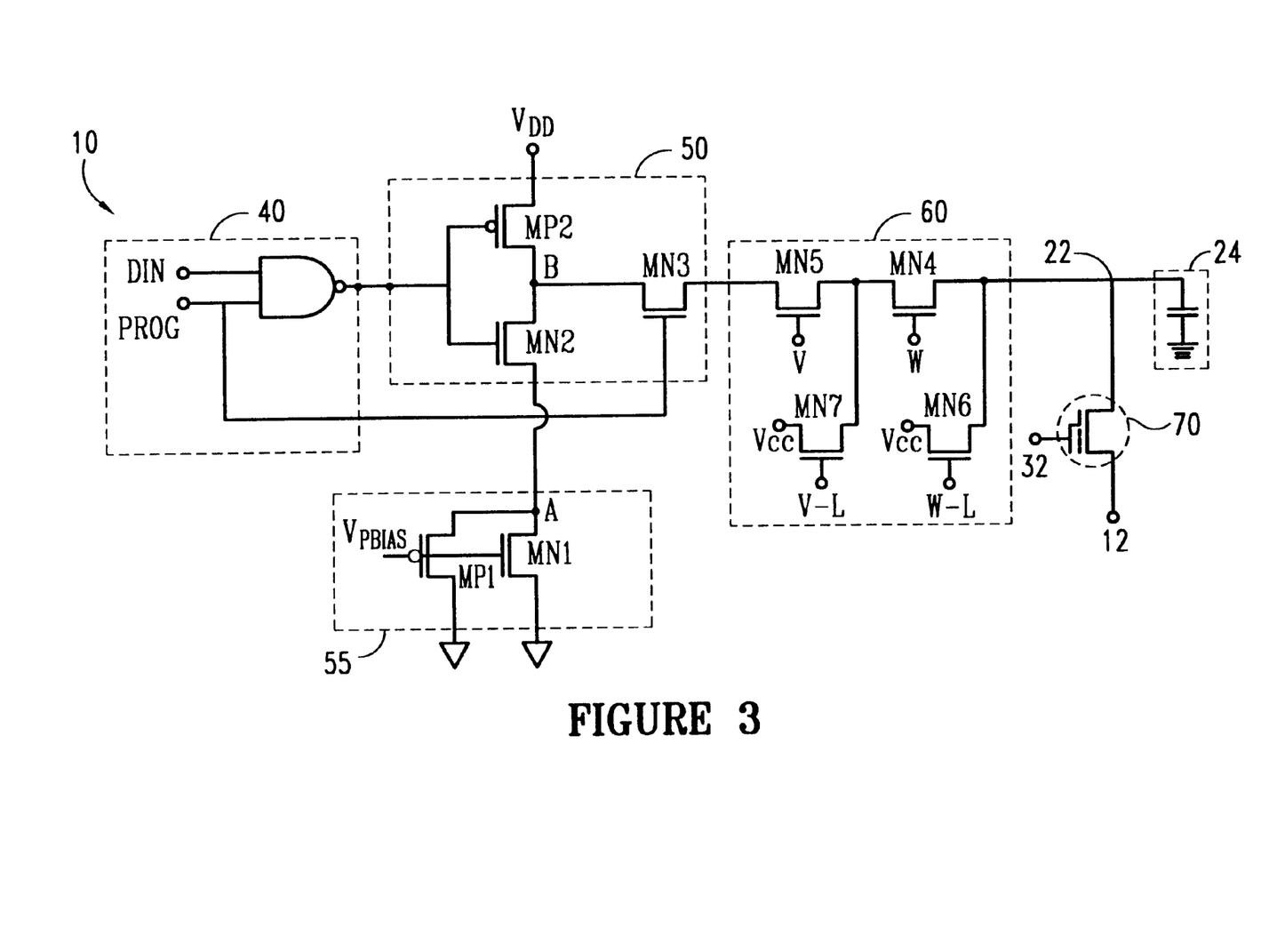
FIG. 3 is a circuitry of the programming of a flash memory cell, in accordance with the present invention.

In the present invention, an improvement circuit in the discharge control block 55 is constructed, and is shown in FIG. 3, except the discharge control block 55 with an additional PMOS transistor MP1 is coupled with the NMOS transistor MN1 in a parallel way. The memory cell 70, the decoder circuit 60, the switch means 50, and data input circuit 40, are all being arranged as aforementioned prior art. It is noted that the data input circuit 40 is a NAND gate 40 with two input terminals DIN and PROG to receive a bit data signal and programming signal. As is understood by a person skilled in the art, the function of NAND gate 40 will be given with an output "0" state if and only if the data and programming signal are all be set at high voltage levels. Otherwise, the output of NAND gate 40 must be at "1" state. For the former case, it will turn on the PMOS transistor MP2 only, and giving an output "high"; hence the memory cell 70 will not be charge with negative charge, i.e. the cell is programming with "1" state. For the other cases, all the outputs of NAND gate 40 are at "1" state, and which turns on the NMOS transistor MN2. However, only as the programming signal is at "1" state can switch on the switch means 50 to programming the addressed memory cell to a "0" state (i.e. DIN="0", and PROG="1").

Figure 4A:
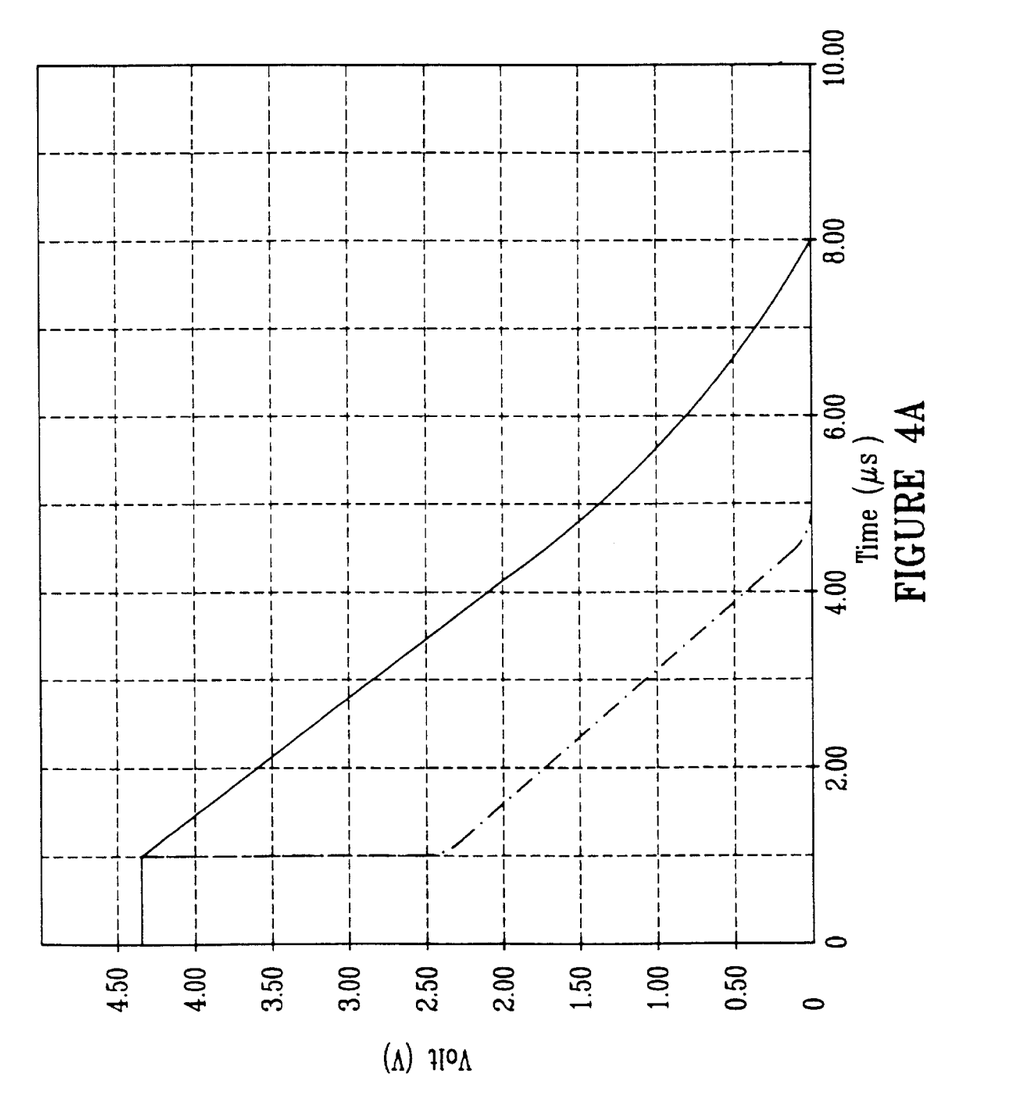
FIG. 4a plots the curves of the discharge of bit line voltage versus time, and given a comparison between discharge control block with and without additional PMOS transistor MP1, in accordance with the present invention.
Figure 4B:
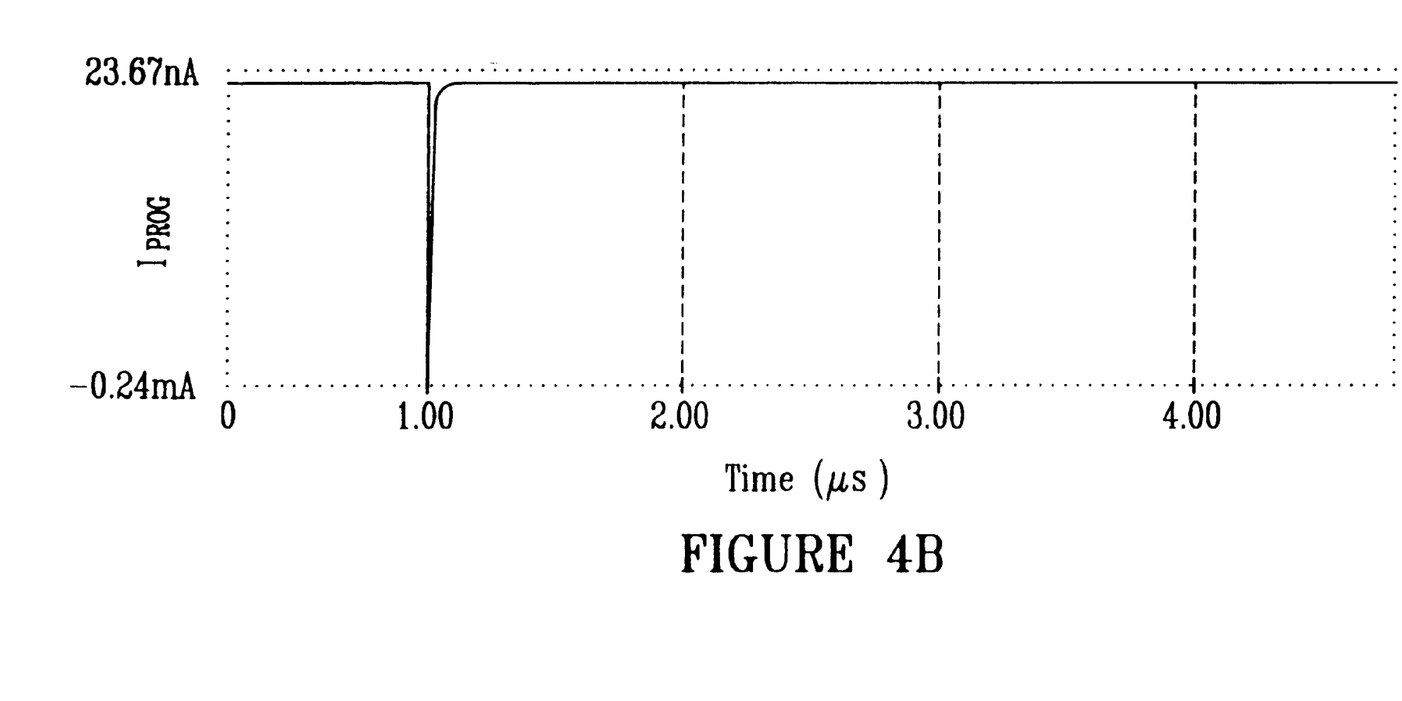
FIG. 4b shows the curve of discharge current vs. time, in the discharge control block with additional PMOS, in accordance with the present invention.

Stilling referring to FIG. 3, the source terminal, the drain terminal of transistor and the gate terminal of MP1 are coupled, respectively, with the drain terminal, source terminal, and the gate terminal of the transistor MN1. And then the source terminal of transistor is responsive to a references voltage (e.g. basis to $V_{SS}$), the drain of the transistor MN1 is responsive to the voltage source (e.g. to voltage $V_{DD}$) through the switch means 50. The gate terminal of the transistor MN1 is biased by a voltage $V_{PBIAS}$ The additional PMOS transistor MP1 provides a shunt circuit and sinks most part of discharge current $I_{PROG}$ when the selected bit line 22 voltage is high, as shown in FIG. 4a–4b. In FIG. 4a plots curves of the discharge of bit line voltage versus time, and given a comparison between discharge control block 55 with and without additional PMOS transistor MP1, which represent by a dotted and a solid curve, respectively. In dotted curve (present invention), the voltage is dropped drastically from 4.5 V to about 1.8 V within an ultra-short time, and then the voltage gradually decreased. It takes about 3.5 $\mu$s to approach the desire voltage 0.6-Volt. The solid curve (prior art) contrary to the dotted curve, the discharge is slowly down to the critical voltage. The time of being consumed is about 6.5 $\mu$s.

FIG. 4b shows the curve of discharge current vs. time, the discharge current are sunk significantly (from 23.67 nA to 0.24 mA within short time) by using additional PMOS transistor MP1. It is noted that the condition for the PMOS transistor MP1 turn on is "$V_A \geq |V_{TP}| + V_{PBIAS}$ "(please turn to FIG. 3 again). Hence, as the bit line voltage 22 drops down to a voltage such that the $V_A - V_{PBIAS} < |V_{TP}|$ (the threshold voltage of the PMOS transistor MP1), the PMOS transistor MP1 will be turn off automatically. And then the programming circuit maintain at "close on" state due to the NMOS transistor MN1. Thus, it doesn't affect the programming cell.

Figure 5:
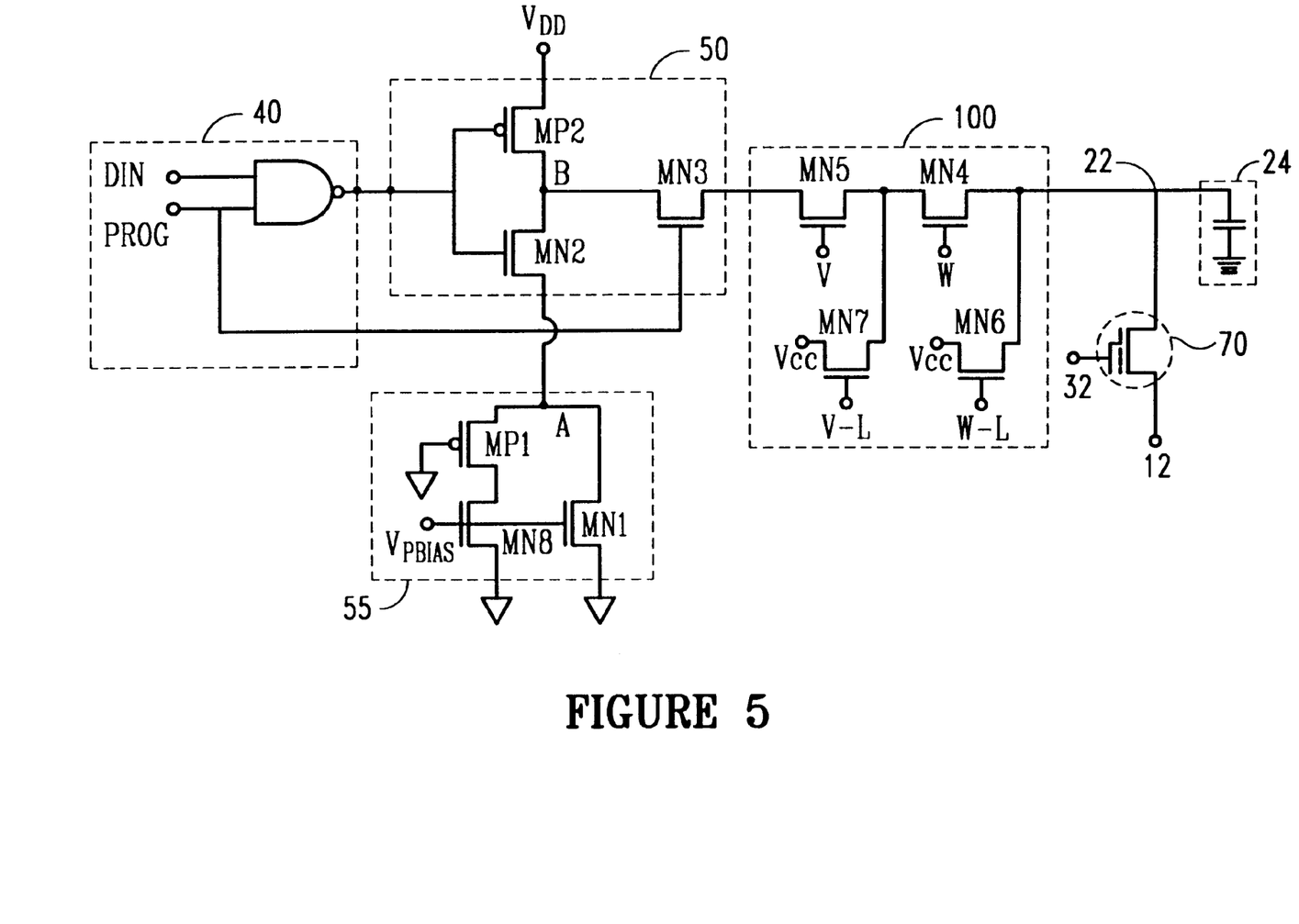
FIG. 5 is another circuitry of the programming of a flash memory cell, in accordance with the present invention.

Referring to FIG. 5, another preferred embodiment is shown. An additional NMOS transistor MN8 is added in the discharge control block 55 compared with forgoing embodiment. In the present embodiment, the PMOS transistor MP1 which is in a series with the transistor MN8 to construct a shunt circuit for the discharge current. The transistor MP1 is with a gate voltage biased to ground. Then the shunt circuit is coupled with the transistor MN1 in a parallel way. Both the transistor NM8 and MN1 are biased to $V_{PBIAS}$. Furthermore, the transistors are arranged such that the size ratio of the MN8/MN1=N, where N>>1, in a preferred embodiment the value N is about 5–10. The purpose of N>>1 is set so that the drain current I (MN8)>>I (MN1). While the transistor MP1 is turn on (i.e. the bit line 22 voltage is higher than the threshold voltage of the transistors MP1), the transistor MN8 can provide larger current (i.e. I (MN8)/I (MN1)=N). When the voltage of node A decreases to a voltage, such that $V_A < |V_{TP}|$, the transistor MP1 will turn off automatically. The advantages of the present embodiment include faster discharge current can be obtained than that of only transistor MN1 in discharge control block 55 (prior art). However, slightly slow bit line 22 discharge current is obtained than that of the forgoing described embodiment, wherein said discharge control block 55 is with only transistors MN1 coupled with MP1 in a parallel.

As is understood by a person skilled in the art, the foregoing preferred embodiment of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. For examples, in the aforementioned preferred embodiment, a split gate flash memory in the programming circuitry is depicted alone. However, as is understood by a person skilled in the art, the memory cell type is not limited to such memory, and the circuitry can be used to program a memory cell such as stacked gate flash memory, or any non-volatile programmable memory too.

What is claimed is:

1. Programming circuit for programming a memory cell, said programming circuit comprising:

data input means for receiving a data signal and a programming signal;

switch means coupled with said data input means and responsive to said programming signal for transmitting said data signal to achieve said memory cell from an output of said data input means;

discharge control means coupled with said switch means, wherein said discharge control means comprises:

a first n-type transistor having a gate terminal, a source terminal and a drain terminal, said gate terminal being responsive to a bias voltage input, said source terminal being responsive to a ground voltage; said drain terminal being coupled with said switch means; and shunt means having a terminal coupled with said drain terminal of said first n-type transistor; and decoder means, coupled with said switch means for addressing said memory cell, wherein said decoder means being controlled by at least one control signal.

2. The programming circuit as in claim 1, wherein said data input means comprises a NAND gate having a data signal input terminal; and a programming signal input terminal.

3. The programming circuit as in claim 1, wherein said switch means comprises:

inverter means coupled with said data input means; and a second n-type transistor, said second n-type transistor is coupled with said inverter means, said second n-type transistor is coupled with said decoder means, and said second n-type transistor having a gate is responsive to programming signal.

4. The programming circuit as in claim 3, wherein said inverter means consisting a CMOS transistor.

5. The programming circuit as in claim 1, wherein said shunt means comprises at least one p-type transistor, said p-type transistor have a gate terminal, a source terminal and a drain terminal, said source terminal of said p-type transistor is coupled with said drain terminal of said first n-type transistor.

6. The programming circuit as in claim 5, wherein said gate terminal of said p-type transistor is responsive to a bias voltage input, said drain terminal of said p-type transistor is responsive to said ground voltage.

7. The programming circuit as in claim 5, said shunt means further comprising a third n-type transistor, said third n-type transistor having a drain terminal being coupled with said drain of said p-type transistor, said third n-type transistor having a source terminal being responsive to the ground voltage, said third n-type transistor having a gate terminal being responsive to said bias voltage input, and said gate terminal of said p-type transistor being responsive to the ground voltage.

8. The programming circuit as in claim 7, wherein said third n-type transistor is with size of about 5–10 times larger than that of said first n-type transistor.

9. Programming circuit for programming a memory cell, said programming circuit comprising:

data input means, for receiving a data signal and a programming signal;

switch means coupled with said data input means and responsive to said programming signal for transmitting said data signal to achieve said memory cell from an output of said data input means;

discharge control means coupled with said switch means, wherein said discharge control means comprises:

a first n-type transistor having a gate terminal, a source terminal and a drain terminal; and a p-type transistor having a gate terminal, a source terminal and a drain terminal, said source terminal of said p-type transistor coupled with said drain terminal of said n-type transistor; said source terminal of said p-type transistor coupled with said and said drain terminal of said p-type transistor, said gate terminal of said p-type transistor coupled with said gate terminal of said n-type transistor, said gate terminal of said p-type transistor is responsive to a voltage bias input, said drain terminal of said p-type transistor coupled with said switch means, and said drain terminal of said p-type transistor is responsive to a ground voltage; and decoder means, coupled with said switch means for addressing said memory cell, wherein said decoder means being controlled by at least one control signal.

10. The programming circuit as in claim 9, wherein said data input means comprises a NAND gate having a bit data signal input terminal; and a programming signal input terminal.

11. The programming circuit as in claim 9, wherein said switch means comprises:

inverter means coupled with said data input means; and a second n-type transistor, said second n-type transistor is coupled with said inverter means, said second n-type transistor is coupled with said decoder means, and said second n-type transistor having a gate is responsive to programming signal.

12. The programming circuit as in claim 11, wherein said inverter means consisting a CMOS transistor.

13. Programming circuit for programming a memory cell, said programming circuit comprising:

data input means, for receiving a data signal and a programming signal;

switch means coupled with said data input means and responsive to said programming signal for transmitting said data signal to achieve said memory cell from an output of said data input means;

discharge control means coupled with said switch means, wherein said discharge control means comprises:

a first n-type transistor having a gate terminal, a source terminal and a drain terminal; and a second n-type transistor having a gate terminal, a source terminal and a drain terminal;

a p-type transistor having a gate terminal, a source terminal and a drain terminal, said source terminal of said p-type transistor coupled with said drain terminal of said first n-type transistor, said source terminal of said p-type transistor coupled with said switch means, said drain terminal of said p-type transistor coupled with said drain terminal of said second n-type transistor, said gate terminal of said p-type transistor being responsive to ground voltage, said gate terminal of said second n-type transistor coupled with said gate terminal of said first n-type transistor being responsive to a voltage bias input, and said source terminal of said second n-type transistors being responsive to the ground voltage; and decoder means, coupled with said switch means for addressing said memory cell, wherein said decoder means under control of at least one control signal.

14. The programming circuit as in claim 13, wherein said data input means comprises a NAND gate having a bit data signal input terminal; and a programming signal input terminal.

15. The programming circuit as in claim 13, wherein said switch means comprises: inverter means coupled with said data input means; and a third n-type transistor coupled with said inverter means, said third n-type transistor is coupled with said decoder means, and said third n-type transistor having a gate is responsive to programming signal.

16. The programming circuit as in claim 15, wherein said inverter means consisting a CMOS transistor.

17. The programming circuit as in claim 13, wherein said second n-type transistor is with size of about 5–10 times larger than that of said first n-type transistor.

* * * * *